Nov. 19, 1968 G. R. REID 3,411,204

CONSTRUCTION OF ELECTRICAL CIRCUITS

Original Filed March 7, 1963 2 Sheets-Sheet 1

INVENTOR
GILBERT R. REID

BY Rene A. Kuypers
ATTORNEY

CONSTRUCTION OF ELECTRICAL CIRCUITS

Original Filed March 7, 1963 2 Sheets-Sheet 2

United States Patent Office 3,411,204

Patented Nov. 19, 1968

3,411,204

CONSTRUCTION OF ELECTRICAL CIRCUITS

Gilbert R. Reid, Norristown, Pa., assignor to Sperry Rand Corporation, New York, N.Y., a corporation of Delaware Original application Mar. 7, 1963, Ser. No. 263,655. Divided and this application July 6, 1965, Ser. No. 469,795

10 Claims. (Cl. 29—625)

ABSTRACT OF THE DISCLOSURE

This disclosure relates to a method for making interconnections in a multi-layer circuit. The method provides for making perforations in the area where a connection is to be made. This is done by means of photographic and chemical techniques only. As a result of the chemical milling process of the invention, an aperture with an uneven side wall is developed through the circuit since the insulation is etched more deeply than the metal. The uneven side wall enables a solid three-sided connection to be made to each printed circuit element when a conductive material is applied to the sides or made to fill the perforation since each element is chemically cleaned by the etching process. As a result, improved continuity is obtained.

This is a division of United States patent application, Ser. No. 263,655, filed Mar. 7, 1963, now abandoned. The present invention relates in general to the construction of multi-layer circuit boards. It relates in particular to a method of mass producing and selectively perforating such multi-layer circuit boards and electrically interconnecting external circuits through certain perforations thereof.

Heretofore, back panel wiring (i.e., the wiring that is necessary to connect together the various circuits of complex electronic circuitry) has become exceedingly expensive and difficult to fabricate. The excessive expense and fabrication difficulties result from the need to use point to point hand wiring in order to provide the required interconnections between the components of sub-circuits and/or building block circuits. A sub-circuit or building-block circuit may be exemplified by an integrated circuit.

Point to point hand wiring has been unsatisfactory, particularly when there is a requirement for such wiring in vast electronic complexes, for example, large data processing machines.

It is therefore an object of this invention to provide a new and improved multi-layer circuit board.

It is a further object of this invention to provide a simple and inexpensive method of perforating a hole pattern in a multi-layer board.

It is a further object of this invention to provide a simple and inexpensive method of interconnecting selected holes of the hole pattern provided in the multi-layer circuit board.

It is a further object of this invention to provide a multi-layer circuit board which furnishes a new and improved interconnecting means for electrical circuitry.

In accordance with a feature of this invention, a circuit board has been constructed wherein thin laminates consisting of metal (from which circuits are etched), are bonded to either side of an insulation substrate. Several of these metal-insulation laminates are further bonded to one another to comprise a multi-layer circuit board.

In accordance with another feature of this invention, a hole pattern is perforated through the circuit board by the use of suitable etchants which exclusively attack either metal or insulation. After perforating the metal and insulation layers of the circuit board, certain of the etched holes are plated so that electrical continuity is obtained between etched circuits through such certain holes. The multi-layer circuit board is adapted to be connected to an external circuit thereby providing a means to obtain electrical continuity between the various components of the external circuit. The multi-layer circuit board is also readily adaptable for use as an interconnecting means to provide continuity connections between several external building-block circuits.

In accordance with another feature of this invention electrical continuity can be readily provided between selected points of a triple layer laminate (i.e., two printed circuits etched on either side of an insulating substrate and hence on a multi-layer laminate). This is accomplished by etching a hole through selected conductors of the uppermost printed circuits, as well as through the intermediate insulating layer. Soldering, welding or other techniques are then used to provide an ohmic connection between the selected conductors of the two printed circuits.

The novel features that are considered characteristic of this invention are set forth with particularity in the appended claims. The invention, itself, however, both as to its organization and method of operation, as well as additional objects and advantages, thereof, will best be understood from the following description when considered in conjunction with the accompanying drawings wherein:

Figure 1:
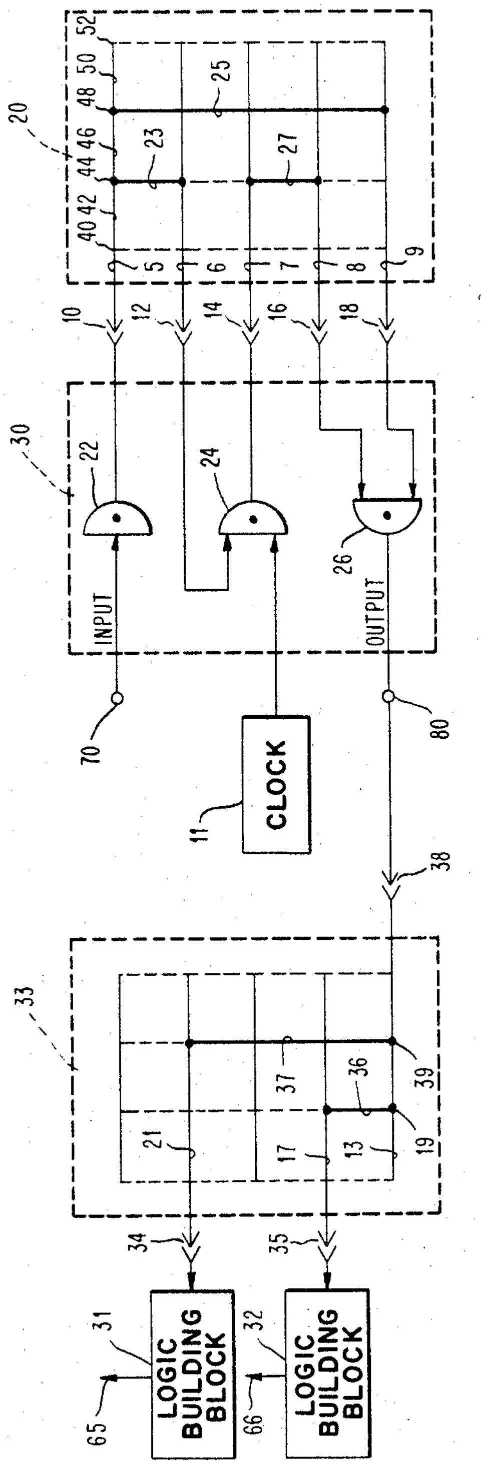
FIGURE 1 is a schematic representation of multi-layer circuit boards of the subject invention shown connected to both a single external logical building-block and to several external logical building-block circuits.

In accordance with the present invention, multi-layer circuits of the subject invention are constructed by bonding together several laminates consisting of printed circuitry etched on an insulating material. During the initial stages of fabrication the external metal layers of the outermost laminates are of a plain metal surface (i.e., the surfaces are completely of metal). The external surfaces are kept plain in order that an etching resist might be readily applied thereto and also to enable the metal to act as a resist for the layer of insulation while the holes are etched. The individual layers of insulation and printed circuitry are extremely thin and together have a thickness on the order of one-tenth to two mils.

In order to provide multiple electrical circuitry connections between external circuits, such as logical building blocks in a data processor, holes are etched into the multi-layer circuit board and accordingly it is made ready to accommodate such external circuits. Such detailed etching is achieved by a series of steps commencing with first applying a suitable resist (material which is resistant to an etchant) to the plain, external metal surfaces everywhere excepting at the required hole locations. Thereafter, a first etchant is applied to the external metal surfaces by, for example, immersion. The first etchant is of the type which attacks only metal and does not remove any of the insulation. The first etchant attacks the metal in all places which do not have a resist applied thereto, and after removing the metal leaves the upper surfaces of the first layer of insulation exposed at the hole locations. This step is followed by etching the insulation exposed at the various hole positions with a suitable etchant, which attacks only the insulation. The process is then repeated for each layer of metal and insulation that becomes alternately exposed during the etching process until the desired hole pattern in the multi-layer circuit board has been made.

After the holes have been etched and after the resist is removed by a suitable means, they are then plated through with an "electroless" solution by immersion therein. Further plating may be provided such as with copper in order to enhance the thickness of the "electroless" plating. Suitable resists are then selectively applied to the plain, external layers (for example by a photo process and gold plating) and a printed circuit pattern is etched thereon. By these expedients, selected printed circuitry conductors of various layers make electrical interconnections through selected holes. The multiple connections created by the plated holes in cooperation with the printed circuitry provide electrical continuity for external circuits (e.g., logical building-blocks).

In a triple layer circuit board consisting of two printed circuits etched on either side of an insulation substrate it is often times necessary to provide electrical continuity between selected conductors of the top and bottom printed circuits. This can be accomplished by perforating in successive steps one of the plain external metal layers and the middle layer of insulation in accordance with the etching process above discussed. After the required hole pattern has been etched through the middle layer, the printed circuit pattern is etched on the plain metal layer. In order to effect the interconnection through the holes solder balls can be dropped into the etched holes and the solder balls fused by passing the unit through a suitable heat source. Other techniques such as by plating with "electroless" copper or by welding may also be used to provide the required ohmic connections. By the above discussed expedients, a simple technique is provided by which electrical continuity is obtained between selected conductors of the printed circuit patterns on each outer side of the board (i.e., via the etched intersecting holes with solder therein).

An extension of the triple layer laminate with its plated hole technique consists in further bonding to either side of the circuit board, other printed circuit laminates as may be required. Thereafter, holes are again etched and interconnections are provided by plating the holes in accordance with one of the aforementioned methods. Accordingly, internal interconnections may be provided in addition to the interconnections that may be fabricated by the normal external etching and plating. This latter type of multi-layer circuit board provides increased versatility over the previously discussed circuit board since it increases the number of interconnections available for external building-block circuits.

Referring now to FIGURE 1, a schematic representation is depicted of a multi-layer circuit board 20 having four layers of printed circuitry, namely 40, 44, 48 and 52. These printed circuit layers are separated by an insulating substrate 42, 46 and 50 upon which the printed circuit is etched. The solid lines 23, 25 and 27 represent individual printed circuit conductors of the printed circuit layers. The dashed lines represent portions of the printed circuit layers which do not have printed circuit conductors etched thereon. The orthogonal lines 5, 6, 7, 8 and 9 represent etched holes developed by the etching process of the subject invention, which have been plated with an electrically conductive material. For ease of understanding, all the holes are schematically shown as being etched completely through, but it will be shown later that this need not necessarily be the case as the holes may be etched partially through. It should be noted that printed circuit 25 does not connect to holes 6, 7 or 8 and therefore does not provide a back circuit to connectors 12, 14 or 16. It should be understood that other segments of printed circuit layers 40, 44, 48 and 52 could be provided, but for ease of understanding the discussion will be limited to conductors 23, 25 and 27.

Circuit assembly 30 outlined in dotted lines depicts external electronic circuitry which may, for example, be logical building-block circuits which are employed in a data processing machine. Circuitry assembly 30 incorporates numerous components such as resistors, capacitors, diodes, etc., which comprise the logical building-block circuits, which are grouped for example into three AND gates 22, 24 and 26 having an input 70 and an output 80. A clock circuit 11 is connected as one of the inputs to gate 24 for timing purposes. In order to provide electrical continuity between the input and output terminals 70 and 80 of the logical circuit, it is evident that point to point connections must be made (i.e., the output 22 must be connected to gates 24 and 26, and gate 24 must be connected to gate 26) in order to make the circuit operative.

In accordance with the subject invention, electrical continuity between the output of gate 22 and the input to gate 24 of the logical building block 30 is provided by multi-layer circuit 20, which incorporates an ohmic connecting circuit having plated holes represented by lines 5 and 6, and the interconnecting conductor 23 of printed circuit 44. The holes 5 and 6 are connected to the conductor 23 by means of a plating material (as can be better seen in FIGURE 2). The male-female connector means 10 and 12 serves to interconnect the multi-layer circuit 20 to external circuit 30. Therefore, the output of the AND gate 22 is shown providing an input for AND gate 24 via the multi-layer circuit board 20.

FIGURE 1 depicts schematically another use of the multi-layer circuit board. In order to obtain electrical continuity between several logical building block circuits such as 30, 31, and 32, a multi-layer circuit 33 similar in design to 20 may be employed. Accordingly, the output 80 of logical building block 30 may be interconnected via multi-layer circuit board 33 and the male-female connectors 34, 35 and 38 to logical building blocks 31 and 32. Circuit board 33 is shown schematically having plated holes 13, 17 and 21 and the printed circuit layers 19 and 39, incorporating printed circuit conductors 36 and 37, respectively. It should be understood, of course, that other conductors could be printed on the printed circuit layers 19 and 39. It can be readily seen therefore that the conductors 36 and 37 interconnect plated holes 13, 17 and 21 and an ohmic connection is provided between external circuits 30 with circuits 31 and 32.

Figure 2:
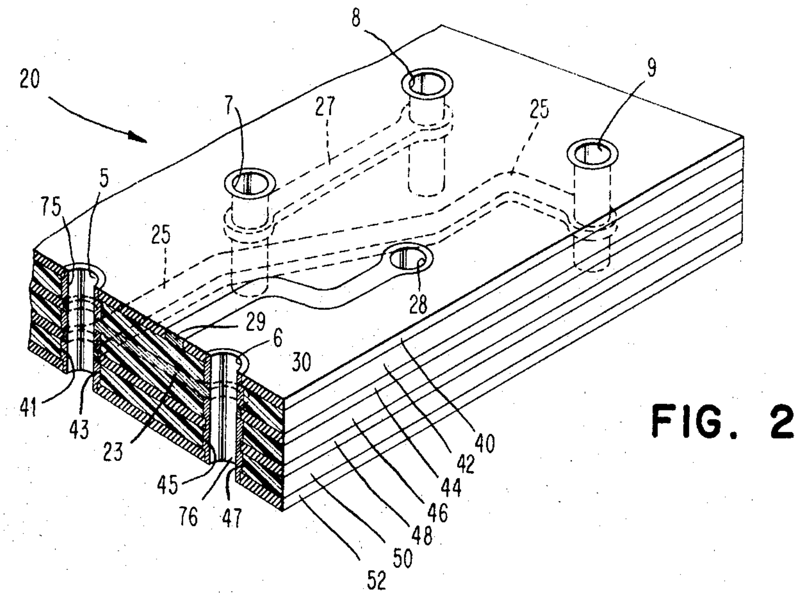
FIGURE 2 is a sectional isometric view of a multi-layer circuit.

FIGURE 2 depicts a sectional view of the multi-laminate circuit 20 of FIGURE 1 wherein a three-layer laminate consisting of two printed circuit layers 44 and 48 are bonded to either side of an insulating layer 46. Two-layer laminates comprising metal layers 40 and 52 bonded respectively to insulating layers 42 and 50 are further bonded to either side of the above mentioned triple layer laminate. The laminates are bonded to one another so that the metal layers alternate with the insulating substrates. It is understood that a laminate may comprise only a single layer. The printed circuit layers are depicted as being made of two types of material in FIGURE 2, for example on layer 40 there is the metal conductor, such as conductor 29, and bonding or potting material 30. Individual printed circuit conductors 23, 25, 27 and 29 are shown forming a part of a more extensive printed circuit pattern. The alternate layers of metal and insulation may be made, for example, of copper and Mylar (a polyester film), although other conductor and insulation material may be employed. The layers may be of any thickness ranging from .1 mil to standard conductor thicknesses of one ounce (0.0014 inch) or two ounces (.0028 inch) without concern for creating burr formations or lifting of the thin printed circuit condutors as encountered when using small drills. The printed circuit layers 44 and 48 are etched before bonding whereas the top and bottom printed circuit layers 40 and 52 are initially of plain metal (i.e., form a solid unetched layer). The top metal layers are later etched in accordance with a desired printed circuit pattern after the bonding of the laminates takes place.

In one mode, a multiple electrical continuity connector for an external circuit is provided by etching a hole pattern such as 5, 6, 7, 8, 9 and 28, into the multi-layer board 20 after the laminates have been bonded into an unitary structure. After a hole pattern has been selected, a resist is applied in registration to the top and bottom layers 40 and 52 excluding the hole locations. The resist that is applied may be by any well known technique such as photo, screened, or other similar method which will resist against the metal and insulation etchants. After the resist is applied, the multi-layer circuit board 20 is immersed in an etchant which may be either ferric chloride, copper chloride, hydrochloric acid or other convenient etchant which will attack the metal but will not attack the resist nor the insulation material (Mylar in the present example). The holes 5 and 6 which are shown in section, as well as the other holes 7, 8, 9 and 28 are etched through the plain metal layers 40 and 52. Next the circuit board is washed in water to remove the metal etchant and then immersed in a bath consisting of a solution of concentrated sulphuric acid. As is understood, the sulphuric acid attacks the Mylar, but does not affect the copper layer 44 and 48, while the copper layers 40 and 52 act as a resist for the remainder of the Mylar which is not exposed at the holes. In this second step the hole pattern is etched through the insulating layers 42 and 50. The etching process is then repeated for each of the remaining layers alternating the etchant for the copper and for the Mylar until the perforations are completed. The alternate etching and washing in water remove all surface impurities leaving all exposed metal surfaces chemically clean.

As a result of the multiple-step etching process, the insulation is undercut along the sides of the perforated holes. The undercutting effect is depicted in FIGURE 2 along the sides 41, 43, and 45, 47 of holes 5 and 6, respectively. This undercutting results from the fact that the immersion of the multi-layer circuit board 20 in the two etchants causes the insulation to be etched more deeply than that of the metal. For example, the etchant will etch more deeply along layer 42 than along layers 40 and 44. The undercuts developed along the sides of the perforated holes produces an important advantage in that they furnish an excellent surface for adhesion by a plating solution.

After the etching process has been completed and the resist is removed by means of a solvent, the perforated holes 5 and 6, for example, are plated by immersing the circuit board in a solution of "electroless" copper. This plating process covers the walls of each hole, for example, holes 5 and 6, with an electrically conductive coating 75 and 76 as well as the two metal surfaces 40 and 52. As a result of the chemically clean metallic surfaces, the "electroless" copper provides a solid three-sided connection to each exposed conductor (i.e., upper, lower and edge). This coating is extremely thin and is on the order of .0001 of an inch. In view of this thinness of the "electroless" plating, the holes and the metal surfaces may be further electroplated with .001 of an inch of copper in order to improve construction of the multi-layer circuit. A printed circuit pattern is then printed on the plain metal surfaces 40 and 52 by, for example, a photo resist method used in conjunction with an ultra-violet light. The ultra-violet light causes a coating applied to the surfaces 40 and 52 to become hardened in all locations except where the printed circuit is to be etched. The multi-layer circuit is then washed in a solvent which removes the unhardened coating from the printed circuit pattern. A gold resist is then plated over the copper printed circuit pattern as well as over the etched apertures. The gold resist has a thickness of approximately 50 to 100 millionths of an inch. The hardened resist is then removed by means of a suitable solvent, thereby leaving exposed copper in those areas where it is to be etched away. The multi-layer circuit is then immersed in copper etchant, thereby forming a printed circuit on layers 40 and 52. By referring to the printed circuit layer 44 in FIGURE 2, it can be readily seen that electrical continuity is achieved in the multi-layer circuit board 20 from plated hole 5 to plated hole 6 via the interconnection (i.e., the printed circuit conductor) 23. Similarly, continuity is attained between plated holes 5 and 9 and plated holes 7 and 8, respectively, via the printed circuit condu ctors 25 and 27, respectively. The multilayer circuit 20 may be used with one or several external logical building block circuits (FIGURE 1) or similar arrangement where electrical continuity for multiple components is required. A portion of the printed circuit pattern 29 is shown connecting aperture 28 after the plain metal layers 40 and 52 have been etched.

The invention readily adapts itself to the mass perforation of holes in a laminated structure of varied compositions whenever the size of the holes required is extremely small, for example, in the order of .062 to 2 mils in diameter. The process that is employed is similar to that disclosed in FIGURE 2 exclusive of the plating process. By first applying a resist and then utilizing appropriate etchant solutions which attack the particular layer compositions, the required holes are developed without employing small, expensive drills which have a tendency to break as well as avoiding the burr formations that result because of the drilling.

It is oftentimes desirable that the multi-layer circuit board include only three layers consisting of two metal printed circuit patterns bonded to either side of an insulating substrate. Furthermore, it is sometimes expedient that electrical continuity be established between selected conductors of the two printed circuits. Such a need is often required in regular printed circuit boards which incorporate an interconnecting scheme for numerous electrical components, such as resistors, capacitors, etc. It is understood, of course, that the circuit of FIGURE 3 may also be employed for interconnecting external building blocks. By referring to FIGURE 3, it may be seen how such a continuity connection may be made in accordance with the process disclosed in the subject invention without restoring to the usual expensive and time consuming drilling process.

Figure 3:
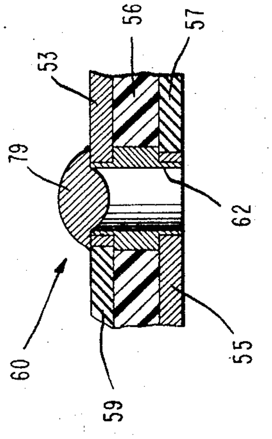
FIGURE 3 is a sectional view depicting a solder ball as a potential connecting means for a triple-layer laminate circuit board.

FIGURE 3 depicts hole 62 etched through conductors at the printed circuit layer 59 and insulating layer 56, but not extending through conductor 55 of the bottom printed circuit layer 57. Again the printed circuit layers are depicted as being made up of two materials, i.e., actually the printed circuit layers originally are made up entirely of metal such as metal 53 and metal 55. When the layers are etched, bonding material or protective material is added which fills the voids that are left when the metal is removed. Hole 62 is also etched through layers 56 and 59 in a similar manner to that disclosed with respect to FIGURE 2. That is, a resist is applied to the outer plain layers 57 and 59 (i.e., before they are etched to form a printed circuit) after they have been bonded together to form a triple-layer laminate. As is well understood, the resist pattern applied to top layer 59 will not be the same as the resist pattern applied to layer 57, since the perforations will not necessarily extend completely through the laminate 60.

After the entire surface of layer 59, excepting where the holes are located, is etched resisted, the board 60 is alternately immersed in an etchant which will attack the metal layer 59 and the insulating layer 56 producing hole 62. After the required hole pattern has been etched and the resist removed by means of a suitable solvent, the metal layers 57 and 59 are again resisted in accordance with a desired printed circuit pattern. Two conductors 53 and 55 are shown as remaining after the etching process has taken place. In order to provide an electrical connection between conductors 53 and 55, a solder ball 79 is positioned in the hole 62. The solder is then fused by passing the entire circuit board 60 through an oven or other heat source. The melted solder fills the hole 62 thereby making an electrical connection between the conductors 53 and 55 of the printed circuit layers 57 and 59. Other connection expedients may be employed such as for example, by putting T-plugs made of welding flux material in the various perforations and then applying one electrode of a welding device to the T-plug and the second electrode to conductor 55 before energizing. After current is applied by the welding machine the plug melts and fills the hole 62 (adhering to the metal strips 62 and 55). Hence, a connection is made between the printed circuit conductors 53 and 55. However, it may be desirable to extend the hole 62 completely through the circuit board 60, in which case, the interconnection between conductors 53 and 55 are provided by the electroless copper coating 75.

Figure 4:
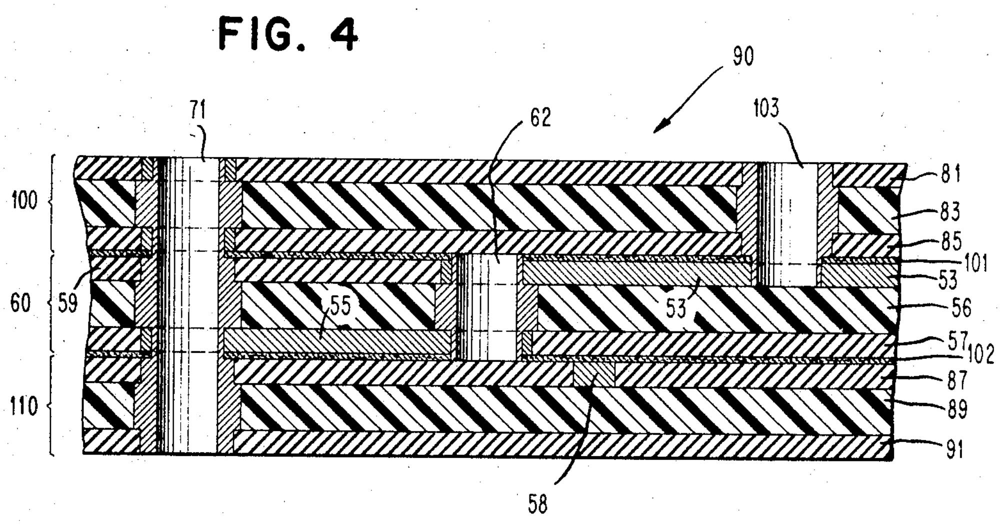
FIGURE 4 depicts a sectional view of another embodiment of a multi-layer circuit board wherein the apertures of the internal laminate are etched before other laminates are bonded thereto.

FIGURE 4 illustrates a further embodiment of the instant invention whereby a multi-layer circuit board 90 can be fabricated to include internal interconnections. This mode of multilayer circuit provides a triple-layer laminate (bracketed by the numeral 60) that is similar in design and manufacture to the structure shown in FIGURE 3, (i.e., the hole 62 is etched only as far as the third layer 57). As in FIGURE 3, the hole 62 might be completely etched through so that interconnections are obtained by the electroless copper coating 75. However, in addition to laminate 60, other triple-layer laminates such as 100 (consisting initially of a plain metal layer 81 and a printed circuit layer 85) and 110 (having initially a plain metal layer 91 and printed circuit layer 87) are bonded to either side of laminate 60. Since layers 53, 85 and 57 and 87 have printed circuits etched thereon, thin insulating films 101 and 102 of epoxy or other material is used to separate the layers. Thereafter, the holes 71 and 103 are etched through by applying a suitable resist in registration to the plain metal surfaces 81 and 91 in all places except where a hole pattern is to be etched (i.e., holes 71 and 103).

The circuit board 90 is then immersed alternately in suitable etchants which attack either the metal or insulation until the holes 71 and 103 are etched as required. The resist is then removed and circuit board 90 is then immersed in an "electroless" solution which plates the sides of the holes 71 and 103 as well as the outer layers 81 and 91 with an electrically conductive material. The "electroless" plating is extremely thin and hence its thickness may be increased by electro-copper plating.

Thereafter, another resist is applied to the plain metal surfaces 81 and 91 by photo resist or other technique (similar to that used in FIGURE 2) in accordance with a desired printed circuit pattern. A further resist using gold, for example, is then applied to the circuitry and the external holes. The photo resist is then removed from the upper surfaces except where the printed circuit is to be retained. The entire circuit board is immersed in an etchant which etches away all the metal required by the printed circuit pattern. As can be readily seen, electrical continuity is established between holes 71, 62 and 103 via the interconnecting printed circuit conductors 53 and 55. It is understood, that numerous variations are possible by those skilled in the art in view of the above teaching, such as for example, using only two laminates instead of three. It should also be recognized that variations in the number of layers per laminate are also readily feasible.

By referring to FIGURE 2, it can be also appreciated that further modifications are within the spirit of the subject invention and may be readily added. For example, it may be desirable in certain situations to separate certain laminates from one another. This can be accomplished by adding another layer of a material that will not be affected by any of the etchants that are employed in the etching process. Such a separating laminate may be made, for example, of a glass epoxy resin.

In summary, the subject invention has devised a method for simply and inexpensively perforating holes in a multilayer circuit board. Such fabrication consists of bonding together thin laminates consisting of printed circuit patterns etched on an insulating substrate; the external metal layers, however, are originally plain surfaced until after the hole etching process takes place. A suitable resist is applied to the external plain layers of metal excepting those locations where perforations are required, and thereafter, the multi-layer unit is immersed alternately in etchants which attack either the insulation or metal. After the etchants have formed holes in the metal and insulating substrates and the resist has been removed, the hole and outer metal layers are plated with an "electroless" plating solution. The plain metal layers are again resisted in accordance with a desired printed circuit pattern and thereafter etched. By means of the above-described expedient, an ohmic connection is obtained between selected apertures via the printed circuits. Thus, a system of interconnections for external circuitry can be economically and simply provided.

The above described invention is readily adaptable to a system whereby before the laminates are bonded into a multi-layer unit, certain internal holes are etched and connected to a printed circuit. Thereafter, other holes are interconnected to the internal aperature thereby increasing the number of interconnections for external circuits. The invention is further adaptable to a system of interconnections between two printed circuits on either side of an insulating substrate.

Obviously, many modifications and variations of the present invention are possible in the light of the above teachings. It is therefore to be understood that within the scope of the appended claims, the invention may be practiced, otherwise than as specifically described.

The embodiments of the invention in which an exclusive property or privilege is claimed are defined as follows:

1. The method of making a multi-layer circuit board comprising the steps of, bonding together at least first and second laminate means, said first laminate means having a metal printed circuit etched on one side and a plain thin metal layer on the reverse side of a thin insulating substrate, said second laminate having a plain thin metal layer on one side of a thin insulating substrate, said insulating and metal layers being alternated with one another, said plain metal layers being oriented externally, applying a first etching resist to said plain metal layers in registration in accordance with a selected pattern to provide at least two apertures, etching said external metal layers of laminate means with a first etchant solution, etching the exposed insulation layer more deeply than said metal layer with a second etchant solution, etching said printed circuit layer with said first etchant solution thereby completing the formation of said apertures, removing said first resist from said external layers with a solvent, plating said etched holes and said plain metal layers with an electroless plating solution and applying a second resist to said external metal layers and to said apertures in accordance with a printed circuit pattern, etching said external metal layers with a metal etchant solution and leaving a printed circuit pattern so as to provide electrical continuity between said plated apertures and one of said printed circuits.

2. The method of making a multi-layer circuit board in accordance with claim 1 wherein a said metal layer comprises copper and is etched by hydrochloric acid.

3. The method of making an interconnection for a multi-layer circuit board comprising at least three layers and having conductors which are positioned on the top layers which are separated by an intermediate insulating layer and wherein said interconnection is to be made to said conductors via the steps of, etching an aperture through said conductors and said insulating layer wherein said diameter of said aperture through said insulation is larger than the diameter through said conductors, locating conducting means within said aperture to obtain an interconnection between conductors, said conducting means being positioned within said aperture so that it makes an ohmic connection to the underside of said conductors as well as to the edge surfaces and upper sides.

4. The method of making a multi-layer circuit in accordance with claim 3 wherein the locating of said conducting means within said aperture comprises the positioning of a plating means along the uneven side walls of said aperture.

5. The method of making a multi-layer circuit in accordance with claim 3 wherein the locating of said conducting means within said aperture comprises completely filling said aperture to provide a solid conductor.

6. The method of making an interconnection for a multi-layer circuit board comprising at least three layers and having conductors which are positioned on the top layers which are separated by an intermediate insulating layer and wherein said interconnection is to be made to said condutcors via the steps of, etching a common aperture through said conductors and insulator so that said conductors jut into said aperture, positioning electrical conducting means within said aperture such that a three-sided connection is made to each said conductor consisting of a connection to the upper, under and edge surfaces, electrical continuity being thereby provided between said conductors.

7. The method of making a multi-layer circuit board according to claim 6 wherein said insulating substrate comprises Mylar and is etched by sulphuric acid.

8. The method in accordance with claim 6 wherein locating an electrically conducting means within said aperture comprises the positioning of a plating means along the uneven side walls of said aperture.

9. The method of making a multi-layer circuit in accordance with claim 6 wherein the locating of said conducting means within said aperture comprises completely filling said aperture to provide a solid conductor.

10. The method of making an interconnection for a multi-layer circuit board in accordance with claim 6 wherein a second aperture is etched which opens upon only one of said conductors, electrical continuity being established between said first and second apertures via said common connected conductor and said electrical conducting means within said apertures.

References Cited

UNITED STATES PATENTS

| | | | |
|---|---|---|---|
| 3,052,957 | 9/1962 | Swanson | 29—626 |
| 3,169,892 | 2/1965 | Lemelson. | |
| 3,184,830 | 5/1965 | Lane et al. | |
| 3,228,093 | 1/1966 | Bratton | 29—625 |
| 3,102,213 | 8/1963 | Bedson | 29—625 X |
| 3,163,588 | 12/1964 | Shortt | 29—625 X |
| 3,219,749 | 11/1965 | Schuster. | |
| 3,311,966 | 4/1967 | Shaheen | 29—625 |

WILLIAM I. BROOKS, *Primary Examiner.*